United States Patent
Abhishek et al.

(10) Patent No.: US 11,075,636 B1
(45) Date of Patent: Jul. 27, 2021

(54) DIFFERENTIAL OUTPUT DRIVER CIRCUIT AND METHOD OF OPERATION

(71) Applicant: NXP USA, Inc., Austin, TX (US)

(72) Inventors: Kumar Abhishek, Bee Cave, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/831,049

(22) Filed: Mar. 26, 2020

(51) Int. Cl.
*H03K 19/0185* (2006.01)
*H03K 17/687* (2006.01)

(52) U.S. Cl.
CPC . *H03K 19/018507* (2013.01); *H03K 17/6877* (2013.01)

(58) Field of Classification Search
CPC ... H03K 19/018514; H03K 19/018521; H03K 19/018528; H03K 19/018535; H03K 19/018542; H03K 19/01855; H03K 19/018557–018592; H03K 17/6877
See application file for complete search history.

(56) References Cited

U.S. PATENT DOCUMENTS

| | | | |
|---|---|---|---|
| 5,296,756 A | 3/1994 | Patel et al. | |
| 6,111,431 A * | 8/2000 | Estrada | H03K 19/0005 326/83 |
| 6,356,141 B1 * | 3/2002 | Yamauchi | G05F 3/262 327/543 |
| 6,590,432 B1 | 7/2003 | Wu et al. | |
| 6,667,650 B2 | 12/2003 | Gammie et al. | |
| 7,012,450 B1 * | 3/2006 | Oner | H04L 25/0276 326/86 |
| 7,061,273 B2 | 6/2006 | Wang et al. | |
| 7,129,756 B2 * | 10/2006 | Omote | H04L 25/0272 326/115 |
| 7,535,258 B1 * | 5/2009 | Johnson | H03F 3/45237 326/68 |
| 7,719,324 B1 * | 5/2010 | Snowdon | H03K 19/018528 326/82 |
| 8,363,705 B2 | 1/2013 | Tang et al. | |
| 9,712,159 B2 * | 7/2017 | Isoda | H03K 17/6872 |
| 2003/0210074 A1 | 11/2003 | Morgan et al. | |
| 2011/0291758 A1 * | 12/2011 | Hsieh | H03F 3/4521 330/253 |

* cited by examiner

Primary Examiner — Patrick C Chen

(57) ABSTRACT

A differential output driver circuit includes a drive path having a first output node that provides a first output differential signal and a second output node that provides a complementary second output differential signal to the first output differential signal, a current control transistor to control current of the drive path, and a current measurement resistor circuit located in the drive current path outside of a path segment between the first and second output node. Current flowing through the drive path flows through the current measurement resistor circuit, and a voltage across the current measurement resistor circuit is indicative of an amount of current flowing through the drive path. A transistor control circuit utilizes a voltage across the current measurement resistor circuit to control a control terminal of the current control transistor to control the current in the drive path based on the voltage across the current measurement resistor circuit.

19 Claims, 4 Drawing Sheets

US 11,075,636 B1

DIFFERENTIAL OUTPUT DRIVER CIRCUIT AND METHOD OF OPERATION

BACKGROUND

Field

This disclosure relates generally to integrated circuits, and more specifically, to a differential output driver circuit.

Related Art

Low Voltage Differential Signal (LVDS) is a technical standard that specifies electrical characteristics of a differential, serial communications protocol. LVDS typically operates at low power and can run at very high speeds, such as 5 Gbps. In an LVDS transmission system, differential signals are provided via a pair of transmission lines to a load in which the pair of lines carry complementary signals.

In an integrated circuit, there may be multiple output lanes, each driven by a corresponding differential transmitter, such as an LVDS transmitter. The voltage swings of the differential outputs transmitted by each of these lanes are subject to mismatch. This mismatch may be due to one or more of mismatch in current references used inside each lane, the effects of drain induced barrier lowering (DIBL), local mismatch and IR drops across the padring, etc. This mismatch may be more problematic when the differential output has a fixed common mode voltage (e.g. 1.2V), but the supply voltage level of the transmitter has a wide supply range (e.g. 3V to 5.5V). The mismatches in voltage swing across the lanes can cause problems in circuits utilizing these differential output signals. Therefore, a need exists to reduce the mismatch across multiple output lanes, including reducing mismatch in designs requiring operation across a wide range of supply voltage levels.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integrated circuit (IC), such as a system on a chip (SoC), includes a plurality of differential transmitters in which each transmitter converts a single ended input signal to complementary output signals. These complementary signals are provided to an output driver stage of the transmitter which drives complementary pad signals, thus providing a differential output for the transmitter. It is desirable for the voltage swings at the differential outputs across the plurality of differential transmitters to match. However, due in some cases to current mismatches, mismatches result among the differential outputs of the plurality of transmitters. Therefore, in one embodiment, a target differential voltage swing for the differential output is set by a current reference generator. The drive path of a differential output driver circuit includes a current measurement resistor to measure current through the drive path. A voltage across the current measurement resistor is fed back to a transistor control circuit for comparison with the target differential voltage swing to control the current in the drive path. By controlling the current through the drive path in this manner, the target output differential swing voltage is maintained and mismatch among differential transmitters of an IC can be reduced. Furthermore, the target differential voltage swing may be provided by the current reference generator to multiple differential transmitters, in which use of this shared reference may also help reduce mismatch among the differential transmitters.

Figure 1:
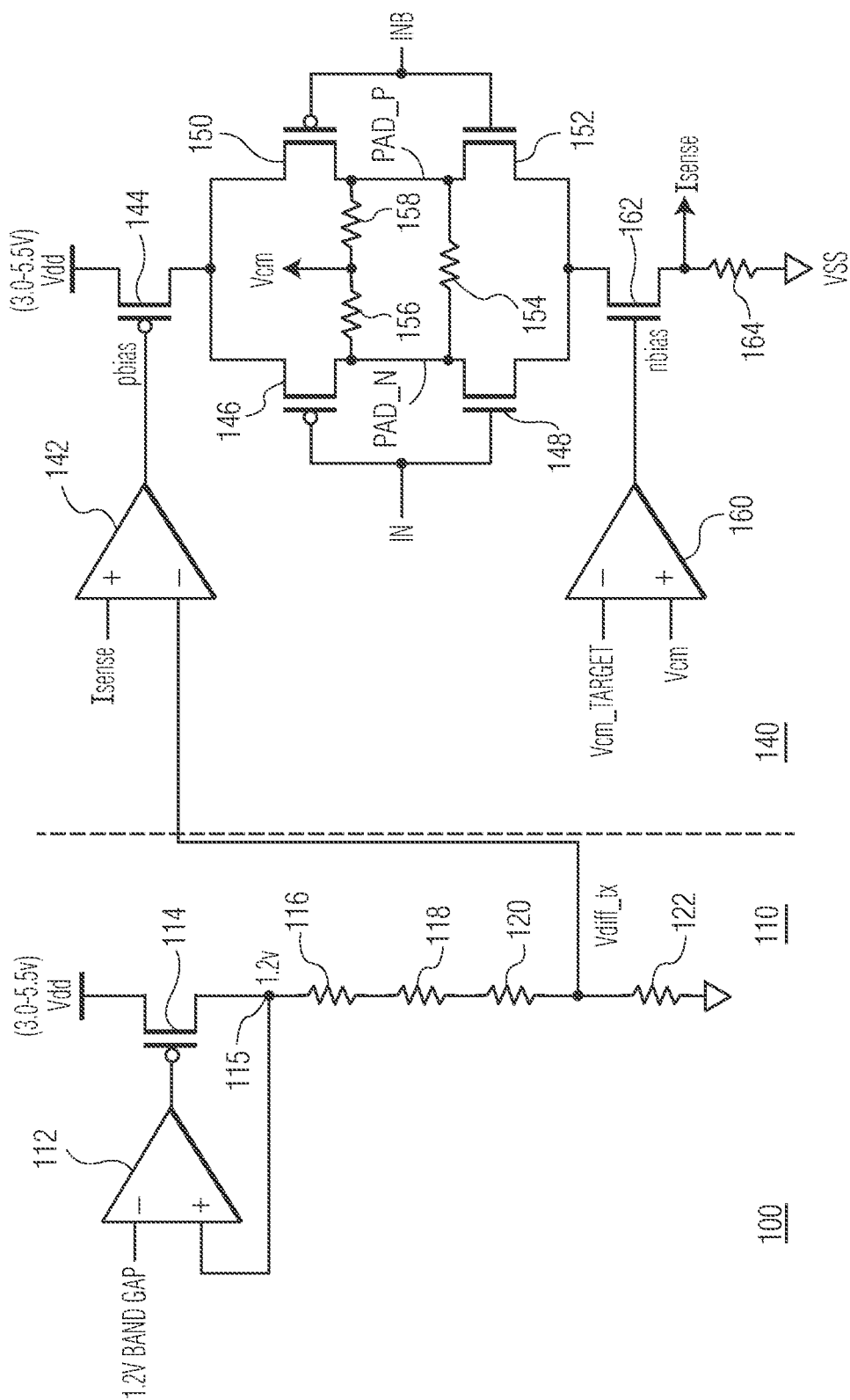
FIG. 1 illustrates, in partial block diagram and partial schematic form, a differential transmitter in accordance with one embodiment of the present invention.

FIG. 1 illustrates an integrated circuit 100 including a reference generator 110 and a differential output diver circuit 140. Reference generator 110 generates a reference current in response to a band gap voltage reference, and converts the reference current to a reference voltage, corresponding to a target differential voltage (Vdiff_tx), which is provided to circuit 140. In one embodiment, differential output driver circuit 140 corresponds to the output driver stage of a differential transmitter, such as an LVDS transmitter. The differential transmitter receives a single ended input signal (not shown), and through one or more stages, converts the single ended input signal to a complementary output signals, including complementary signals IN and INB. Differential output driver circuit 140 receives Vdiff_tx, IN and INB and outputs complementary pad signals Pad_N and Pad_P. The pad signals are provided to output pads (i.e. external terminals) and may be transmitted via a pair of transmission lines to a load in which the pair of transmission lines carry the complementary signals. In one example, the pair of transmission lines may be twisted wires or traces on a printed circuit board.

Reference generator 110 includes an amplifier 112 having an inverting input coupled to receive a bandgap voltage, which may be 1.2 V, and a non-inverting input coupled to a circuit node 115. An output of amplifier 112 is coupled to a control electrode of a PMOS transistor 114. A first current electrode of transistor 114 is coupled to a first voltage supply terminal which is coupled to receive a first supply voltage, Vdd. In one embodiment, Vdd can be set to a voltage within a particular range, such as in a range of 3.0V to 5.5V. A second current electrode is coupled to circuit node 115. Series-connected resistors 116, 118, 120, and 122 are coupled between circuit node 115, and a second voltage supply terminal coupled to receive a second supply voltage, Vss, which is less than Vdd. A circuit node between series-connected resistors 120 and 122 provides Vdiff_tx. In operation, amplifier 112 and transistor 114 operate to place the band gap voltage on node 115, resulting in a reference current through the series-connected resistors (thus operated as a voltage to current, V2I, converter). Vdiff_tx corresponds to the voltage resulting from the reference current through resistor 122. The values of the band gap voltage and of resistors 116, 118, 120, and 122 are set to provide a desired or target voltage swing between the differential outputs Pad_N and Pad_P of output driver circuit 140. For example, in one embodiment in which Vdd can be between 3.0V and 5.5V, and band gap voltage is 1.2V, each resistor 116, 118, 120, and 122 is selected as 3K ohms, resulting in a target swing voltage of 300 mV. Alternate embodiments may use different circuit configurations to provide the target or desired voltage swing.

Output driver circuit 140 includes a comparator 142, PMOS transistors 144 146, and 150, NMOS transistor 162, resistors 156, 158, 154, and 164, and comparator 160. Comparators 142 and 160 can be referred to as comparison circuits and may be implemented as a comparator or operational amplifier. A non-inverting input of comparator 142 is coupled to receive a voltage, Isense, and an inverting input of comparator 142 is coupled to receive Vdiff_tx from reference generator 110. An output of comparator 142 is coupled to provide pbias to a control electrode of PMOS 144. Transistor 144 has a first current electrode coupled to the first supply voltage terminal which receives Vdd and a second current electrode coupled to first current electrodes of transistors 146 and 150. A second current electrode of transistor 146 is coupled to a first terminal of resistor 156, a first terminal of resistor 154, and a first current electrode of transistor 148. A second current electrode of transistor 148 is coupled to a first current electrode of transistor 162. A second terminal of resistor 156 is coupled to a first terminal of resistor 158. A second current electrode of transistor 150 is coupled to a second terminal of resistor 158, a second terminal of resistor 154, and a first current electrode of transistor 152. A second current electrode of transistor 152 is coupled to the second current electrode of transistor 148 and the first current electrode of transistor 162. The circuit node between the second terminal of resistor 156 and the first terminal of resistor 158 provides the common mode voltage, Vcm, of the output differential signals Pad_N and Pad_P. In one embodiment, resistors 156 and 156 each have a resistance of 10K Ohms and resistor 154 has a resistance of 100 Ohms. In one embodiment, resister 154 may be located outside the chip (e.g. outside IC 100).

Still referring to FIG. 1, an inverting input of comparator 160 receives a common mode target voltage, Vcm_target, which, in one embodiment, is 1.2V. A non-inverting input of comparator 160 receives Vcm. An output of comparator 160 is coupled to provide nbias to a control electrode of transistor 162. A second current electrode of transistor 162 is coupled to a first terminal of resistor 164, and a second terminal of resistor 164 is coupled to the second supply voltage terminal. In the illustrated embodiment, resistor 164 has a resistance of 100 Ohms, and the first terminal of resistor 164 provides the voltage, Isense, which is provided as an input to comparator 142.

In operation, complementary signals are provided as IN and INB to generate output differential signals Pad_P and Pad_N. For example, if IN is a logic level high (and thus INB is a logic level low), then transistors 148 and 150 are turned on and transistors 146 and 152 are turned off, resulting in Pad_P being driven to a logic level high and Pad_N to a logic level low. Conversely, if IN is a logic level low (and thus INB is a logic level high), then transistors 146 and 152 are turned on and transistors 148 and 150 are turned off, resulting in Pad_N being driven to a logic level high and Pad_P to a logic level low. Note that transistors 146, 148, 150, and 152 may each be referred to as a switch, in which these switches control current flow from Pad_P to Pad_N or from Pad_N to Pad_P (depending on the values of IN and INB).

In the illustrated embodiment, Pad_P and Pad_N are differential signals. The voltage swing of the differential output is represented as the difference between the voltage at Pad_P and the voltage at Pad_N. A current drive path is therefore provided through transistor 144, transistor 146/152 or transistor 150/148 (depending on the values of IN and INB), transistor 162, and resistor 164. The drive path also includes a common mode resistor circuit, including resistors 156 and 158 coupled in series between Pad_N and Pad_P and including the common voltage sense node, Vcm.

As discussed above, it is desirable to control current in the drive path to ensure that the common mode voltage and the voltage swing between Pad_P and Pad_N stay at the desired targets. This helps reduce mismatch between various transmitters on chip. Resistor 164 provides a current measurement resistor circuit which measures the current in the drive path, and provides the sensed voltage, Isense, in response to the measured current. Isense is compared with the target swing voltage, Vdiff_tx, and modulates the current in the drive path provided by transistor 144 by controlling pbias at the control electrode of transistor 144 based on the comparison. Therefore, comparator 142 (also referred to as a transistor control circuit) utilizes the voltage across the current measurement resistor to control the current in the drive path based on the voltage across the current measurement resistor. In this manner, the current in the drive path is modulated to produce the desired voltage swing. Also, Vcm is compared to the target common mode voltage, Vcm_target, which modulates the resistance of transistor 162 to properly maintain Vcm at its target level.

Figure 2:
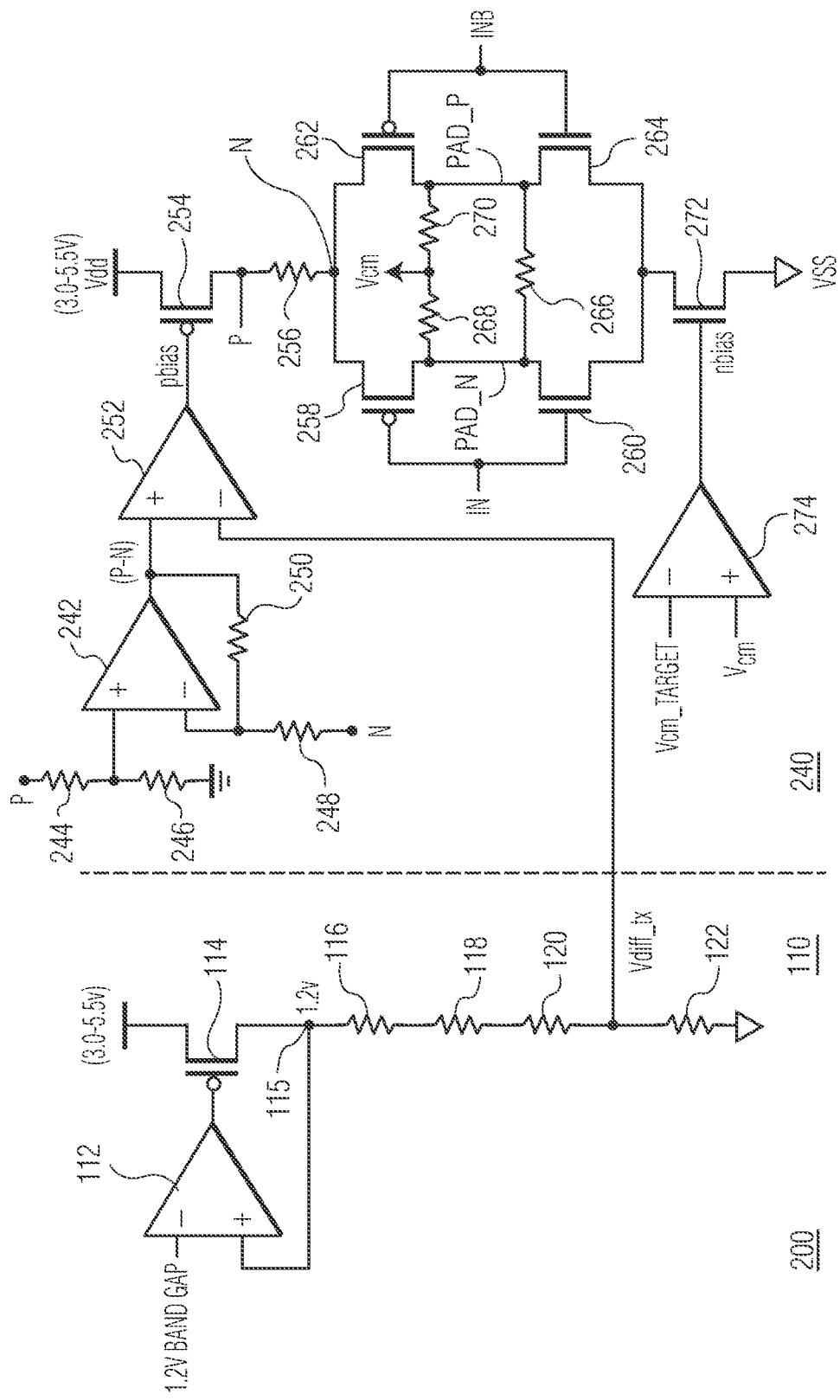
FIG. 2 illustrates, in partial block diagram and partial schematic form, a differential transmitter in accordance with one embodiment of the present invention

FIG. 2 illustrates an integrated circuit 200 including reference generator 110 and a differential output diver circuit 240. Note that the same reference voltage, Vdiff_tx, which is provided to differential output driver circuit 140 may also be provided to differential output driver circuit 240. (Alternatively, a different reference generator can generate this reference for differential output driver circuit 240.) In one embodiment, differential output driver circuit 240 corresponds to the driver stage of a differential transmitter, such as an LVDS transmitter. The differential transmitter receives a single ended input signal (not shown), and through one or more stages, converts the single ended input signal to a complementary output signals, including complementary signals IN and INB. Differential output driver circuit 240 receives Vdiff_tx, IN and INB and outputs complementary pad signals Pad_N and Pad_P. The pad signals are provided to output pads (i.e. external terminals) and may be transmitted via a pair of transmission lines to a load in which the pair of transmission lines carry the complementary signals. In one example, the pair of transmission lines may be twisted wires or traces on a printed circuit board.

Transistors 258, 260, 262, and 264, and resistors 266, 268, and 270 of output driver 240 are coupled analogously to transistors 146, 148, 150, and 152 and resistors 154, 156, and 158, respectively, of output driver 140 of FIG. 1. Differential output driver 240 also includes comparators 242, 252, and 274, PMOS transistor 254, resistors 256, 244, 246, 248, and 250, and NMOS transistor 272. A first terminal of transistor 254 is coupled to the first voltage supply terminal, an output of comparator 252 is coupled to provide pbias to a control electrode of transistor 254, and a second current electrode of transistor 254 is coupled to a circuit node, P, at a first terminal of resistor 256. A second terminal of resistor 256 is coupled to a circuit node, N, at first current electrodes of transistors 258 and 262. A first current electrode of transistor 272 is coupled to the second current electrodes of transistors 260 and 264. A control electrode of transistor 272 is coupled to an output of comparator 274 to receive nbias, and a second current electrode of transistor 272 is coupled to the second voltage supply terminal.

A first terminal of resistor 244 is coupled to circuit node P, a second terminal of resistor 244 is coupled to a non-inverting input of comparator 242. A first terminal of resistor 246 is coupled to the second terminal of resistor 244 and to the non-inverting input of comparator 242. An inverting input of comparator 242 is coupled to a first terminal of resistor 248 and to a first terminal of resistor 250. A second terminal of resistor 248 is coupled to the circuit node N, and a second terminal of resistor 250 is coupled to the output of comparator 242. In the illustrated embodiment, each of resistors 244, 246, 248, and 250 have a same resistance of 50 k Ohms each. An inverting input of comparator 274 is coupled to receive Vcm_target, which may also be 1.2V in the example of FIG. 2, and a non-inverting input of comparator 274 is coupled to receive Vcm.

In operation, note that transistors 258, 260, 262, and 264, and resistors 266, 268, and 270 of output driver 240 operate analogously to transistors 146, 148, 150, and 152 and resistors 154, 156, and 158, respectively, of FIG. 1. For example, when IN is a logic level high (and thus INB is a logic level low), then transistors 260 and 262 are turned on and transistors 258 and 264 are turned off, resulting in Pad_P being driven to a logic level high and Pad_N to a logic level low. Conversely, if IN is a logic level low (and thus INB is a logic level high), then transistors 258 and 264 are turned on and transistors 260 and 262 are turned off, resulting in Pad_N being driven to a logic level high and Pad_P to a logic level low. Note that transistors 258, 260, 262, and 264 may also each be referred to as a switch, in which these switches control current flow from Pad_P to Pad_N or from Pad_N to Pad_P (depending on the values of IN and INB).

In the embodiment of FIG. 2, a current drive path is therefore provided through transistor 254, transistor 258/262 or transistor 262/260 (depending on the values of IN and INB), and transistor 272. The drive path also includes a common mode resistor circuit which is the same as the common mode resistor circuit of FIG. 1, including resistors 268 and 270 coupled in series between Pad_N and Pad_P and including the common voltage sense node, Vcm.

In the illustrated embodiment, resistor 256 operates as a current measurement resistor circuit which measures the current in the drive path, and results in voltages at nodes P and N which are used to determine the voltage drop over the resistor. With node P coupled to the non-inverting input of comparator 242, and node N coupled to the inverting input of comparator 242, the output of comparator 242 provides the voltage difference between node P and N and is thus labeled as (P–N). P–N corresponds to the voltage drop over resistor 256. This voltage drop is provided to the non-inverting input of comparator 252 which compares it to the desired voltage swing of Vdiff_tx, and modulates the current in the drive path provided by transistor 254 by controlling pbias at the control electrode of transistor 254. Therefore, comparators 242 and 252 may collectively be referred to as a transistor control circuit which utilizes the voltage across the current measurement resistor to control the current in the drive path based on the voltage across the current measurement resistor. In this manner, the current in the drive path is modulated to produce the desired voltage swing. Also, as is the case in FIG. 1 with comparator 160 and transistor 162, Vcm is compared to the target common mode voltage, Vcm_target, by comparator 274 which modulates the resistance of transistor 272 to properly maintain Vcm.

Therefore both resistor 164 of FIG. 1 and resistor 256 of FIG. 2 operate as current measurement resistors which allows for the measurement of current in the drive path of the output stage of the corresponding differential output driver. Note that the current measurement resistor, resistor 164 or 256, is located in the drive path of the output stage of the differential output diver circuit 140 or 240, respectively, but is outside of the path segment between Pad_N and Pad_P (e.g. outside of the common mode resistor circuit). Further, in the embodiment of FIG. 1, this current measurement resistor is located between the second voltage supply terminal and the second current electrodes of transistors 148 and 152 (i.e. between the second voltage supply terminal and switches 148 and 152). However, in the embodiment of FIG. 2, this current measurement resistor is located between the first supply terminal and the first current electrodes of transistors 258 and 262 (i.e. between the first voltage supply terminal and switches 158 and 262). Through the use of current measurement resistors, located outside the path segment between Pad_N and Pad_P, the current in the drive path can be controlled to maintain it at a desired current (e.g. 3 mA through the current measurement resistor) thus setting the voltage swing to the desired voltage, regardless of the variation in the power supply provided to the first power supply terminal. For example, Vdd may vary between 3V and 5.5V, yet by modulating the current in the drive path based on the voltage drop over the current measurement resistor, the desired swing voltage can be maintained, thus allowing for improved matching among various differential output drivers.

Figure 3:
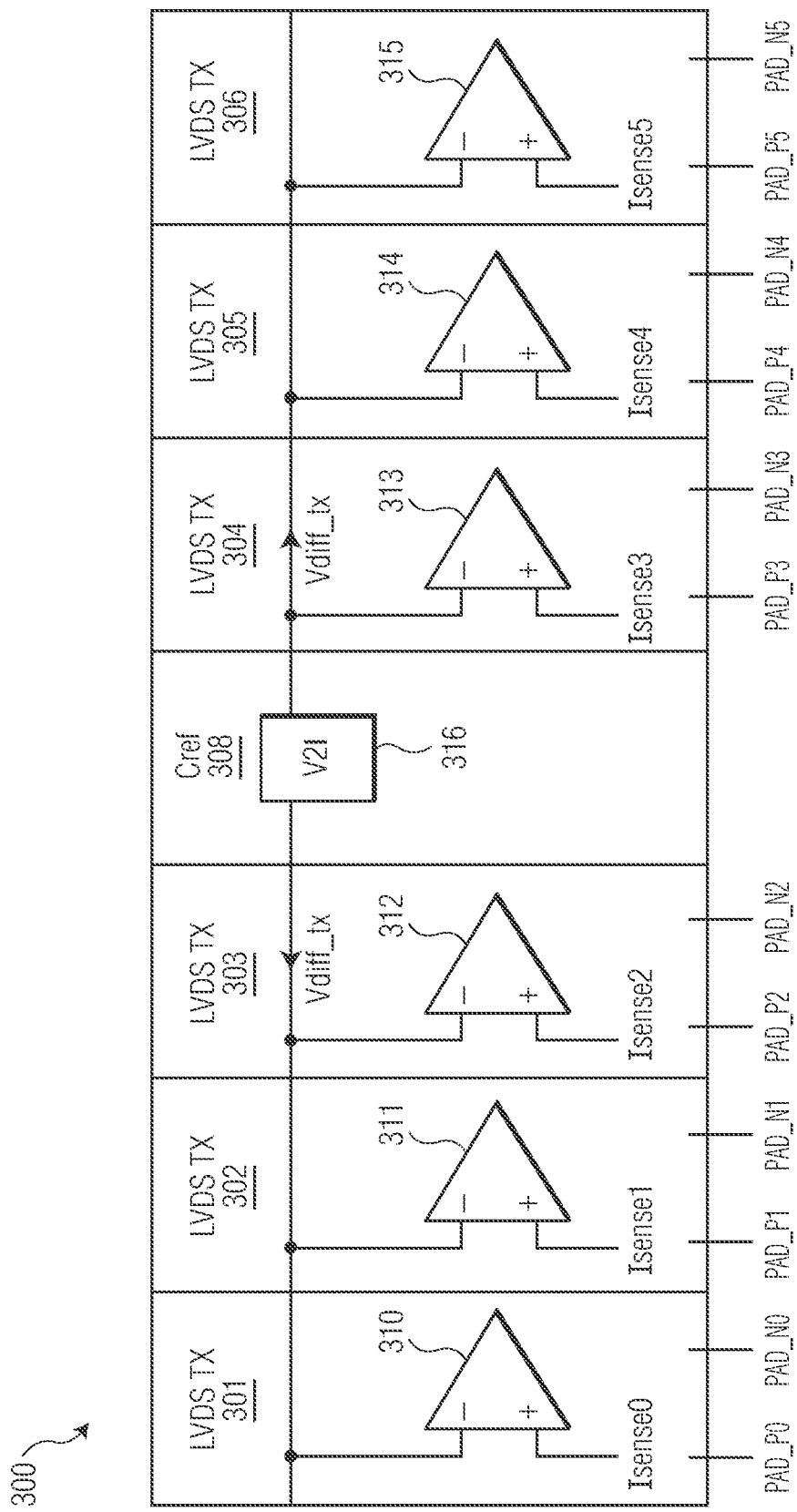
FIG. 3 illustrates, in block diagram form, an integrated circuit including a plurality of differential transmitters, in accordance with one embodiment of the present invention.

FIG. 3 illustrates an integrated circuit 300 having a plurality of differential transmitters, such as LVDS transmitters 301-306, in which each transmitter is located in its corresponding lane. These transmitters may be located in a pad ring of integrated circuit 300. Each transmitter provides differential output signals for the corresponding lane. For example, transmitter 301 provides differential output signals Pad_P0 and Pad_N0, transmitter 302 provides differential output signals Pad_P1 and Pad_N1, etc. Each of the transmitters 301-306 may include a differential output driver circuit similar to differential output driver circuit 140. A current reference cell 308 may include a V2I converter circuit 316 which may correspond to the circuitry of reference generator 110 illustrated in the example of FIGS. 1 and 2, in which the output of converter 316 is the reference Vdiff_tx which is provided to all of transmitters 301-306. By sharing this reference voltage, mismatch between the transmitters can be further reduced. Also, comparators 310-315 in each of transmitters 301-306, respectively, correspond to comparator 142 of FIG. 1 (or comparator 252 of FIG. 2), in which each comparator receives its corresponding Isense voltage as the voltage drop over a current measurement resistor located in the output stage of the differential output driver of the corresponding transmitter. (The remainder of the circuitry of each transmitter or of the output stage is not being illustrated for the sake of simplicity, but may include circuitry similar to that of FIG. 1 or FIG. 2)

Therefore, Isense( ) may correspond to the voltage sensed in response to current measured by the current measurement resistor in the differential output driver of transmitter 301. Similarly, Isense1 may correspond to the voltage sensed in response to current measured by the current measurement resistor in the differential output driver of transmitter 302. Note that in reference to the embodiment of FIG. 1, the sensed voltage Isense corresponds to the voltage drop over resistor 164, and in reference to the embodiment of FIG. 2, the sensed voltage Isense corresponds to the voltage drop over resistor 256. With each of Isense0-Isense5 being matched to a single reference, Vdiff_tx, and by comparing the voltage drop over the current measurement circuit to Vdiff_tx to control the current in the drive path, improved matching may be achieved among LVDS transmitters 301-306.

Figure 4:
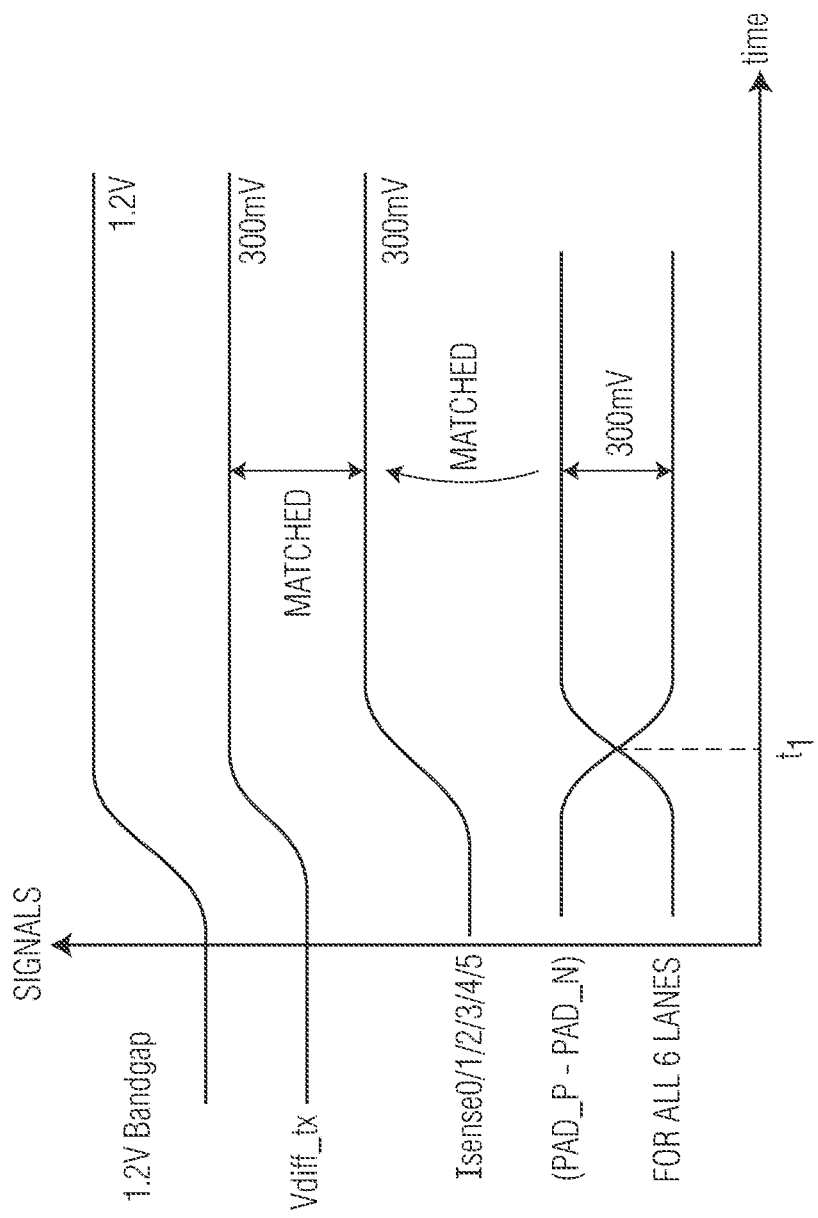
FIG. 4 illustrates a timing diagram of various signals in the circuit of FIG. 3, in accordance with one embodiment of the present invention.

FIG. 4 illustrates the differential output signals provided by each of the 6 lanes of FIG. 3. In the illustrated embodiment of FIG. 4, the bandgap voltage used in reference generator 308 corresponds to 1.2V. Each of the 6 transmitters (in the 6 lanes) receives the same Vdiff_tx, which may be 300 mV. The sensed voltage drop over the current measurement resistor in each lane (corresponding to Isense0-5) are all at about 300 mV since they are all controlled to match the same Vdiff_tx. That is, the transistor control circuits, based on the difference between Isense and Vdiff_tx, controls the current in the drive path of the output stage of each transmitter, resulting in a matched voltage swing of 300 mV across all 6 lanes. Furthermore, with the controlled current in the drive path, the cross over point of the differential signals in each lane upon a change of state of the input (e.g. IN) occurs at time t1. Without matching, this crossover point would occur at different times for each lane, and the voltage swings may also not match across all lanes.

Therefore, by now it can be understood how improved matching may be achieved, even with a wide range of variation of the supply voltage, across multiple transmitter lanes by measuring a drive path current and modulating the drive path current based on a desired voltage swing of the differential output signal. The drive path current is measured using a current measuring resistor which is located outside the switches of the output path and thus outside the common mode resistor circuit between the output nodes. A separate transistor control circuit (e.g. comparator) may be used to modulate a resistance in the drive path to also maintain a consistent common mode voltage, Vcm.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of transmitter 100, transmitter 200, or IC 300 are each circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the current measurement resistors of FIGS. 1 and 2 can be referred to as current measurement resistor circuits and may be implemented with multiple resistors or with different configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a differential output driver circuit includes a drive path which includes a first output node that provides a first output differential signal and a second output node that provides a complementary second output differential signal to the first output differential signal; a current control transistor to control current of the drive path; and a current measurement resistor circuit located in the drive current path outside of a path segment between the first output node and the second output node, wherein current flowing through the drive path flows through the current measurement resistor circuit, wherein a voltage across the current measurement resistor circuit is indicative of an amount of current flowing through the drive path. The differential output driver circuit also includes a transistor control circuit that utilizes a voltage across the current measurement resistor circuit to control a control terminal of the current control transistor to control the current in the drive path based on the voltage across the current measurement resistor circuit. In one aspect, the current controlled by the current control transistor is set by the transistor control circuit to provide a desired differential output voltage swing between the first output node and the second output node. In another aspect, the differential output driver circuit further includes a plurality of switches, wherein the plurality of switches control current to flow from the first output node to the second output node when conveying a first output value and control current to flow from the second output node to the first node to convey a second output value opposite the first output value; wherein the current measurement resistor circuit is located in the current path between a low voltage supply terminal of the drive path and the plurality of switches. In a further aspect, the current control transistor is located in the drive path between a high voltage supply terminal of the drive path and the plurality of switches. In another aspect of the above embodiment, the transistor control circuit includes a comparison circuit with the first input to receive a voltage indicative of the voltage across the current measurement resistor circuit, a second input to receive a reference voltage, and an output to control the control terminal of the current control transistor. In a further aspect, the differential output driver circuit includes a second comparison circuit including a first input coupled to a first terminal of the current measurement resistor circuit, a second input coupled to a second terminal of the current measurement resistor circuit, and an output coupled to the first input of the comparison circuit. In another aspect, the differential output driver circuit further includes a plurality of switches, wherein the plurality of switches control current to flow from the first output node to the second output node when conveying a first output value and control current to flow from the second output node to the first node to convey a second output value opposite the first output value; wherein the current measurement resistor circuit is located in the current path between a high voltage supply terminal of the drive path and the plurality of switches. In a further aspect, the current control transistor is located in the drive path between a high voltage supply terminal and the plurality of switches. In yet another aspect of the above embodiment, the differential output driver circuit further includes a plurality of switches, wherein the plurality of switches control current to flow from the first output node to the second output node when conveying a first output value and control current to flow from the second output node to the first node to convey a second output value opposite the first output value; wherein the plurality of switches includes a first switch, a second switch, a third switch, and a fourth switch, the conductivity of the first switch and the second switch are controlled by a first input differential signal and the conductivity of the third switch and the fourth switch are controlled by a second input differential signal that is complementary to the first input differential signal, the first output node is connected to a first current terminal of the first switch and a first current terminal of the second switch, the second output node is connected to a first current terminal of the third switch and a first current terminals of the fourth switch. In another aspect, the drive path includes a common mode voltage resistor circuit connected between the first output node and the second output node and including a sense node, the drive path includes a common mode voltage control transistor for controlling the common mode voltage of the first output differential signal and the second output differential signal, wherein the differential output driver circuit includes: a common mode transistor control circuit that includes a first input coupled to the sense node and a second input coupled to receive a reference common mode voltage, the common mode transistor control circuit utilizes the first input and the second input to control a control terminal of the common mode voltage control transistor to control the common mode voltage of the first output differential signal and the second output differential signal. In another aspect, a circuit includes a plurality differential output driver circuits. In a further aspect, the transistor control circuit of each differential output driver circuit of the plurality includes a comparison circuit with a first input to receive a voltage indicative of the voltage across the current measurement resistor circuit of the each differential output driver circuit, a second input to receive a reference voltage, and an output to control the control terminal of the current control transistor of the each differential output driver circuit, and the circuit further includes a reference voltage generation circuit to provide the reference voltage to the first input of the comparison circuit of each differential output driver circuit of the plurality. In another aspect of the circuit, the reference voltage is indicative of a desired voltage swing between the first output node and the second output node of each of the differential output driver circuits of the plurality.

In another embodiment, a method of operating a differential output driver circuit, wherein the differential output driver circuit includes a drive path including a first output node that provides a first output differential signal and a second output node that provides a complementary output differential signal to the first output differential signal, includes providing first voltage indicative of a voltage across a current measurement resistor circuit located in the drive path outside of a path segment of the drive path between the first output node and the second output node, wherein current flowing through the drive path flows through the current measurement resistor circuit, wherein the voltage across the current measurement resistor circuit is indicative of an amount of current flowing through the drive path; comparing the first voltage with a reference voltage to produce a signal that controls a control terminal of a current control transistor of the drive path to control the current in the drive path. In one aspect of the another embodiment, the current controlled by the current control transistor is set to provide a desired differential output voltage swing between the first output node and the second output node. In another aspect, the drive path includes a plurality of switches, wherein the plurality of switches control current to flow from the first output node to the second output node when conveying a first output value and control current to flow from the second output node to the first output node to convey a second output value opposite the first output value, wherein the current measurement resistor circuit is located in the current path between a low voltage supply terminal of the drive path and the plurality of switches. In a further aspect, the current control transistor is located in the current path between a high voltage supply terminal of the drive path and the plurality of switches. In another aspect of the another embodiment, the drive path includes a plurality of switches, wherein the plurality of switches control current to flow from the first output node to the second output node when conveying a first output value and control current to flow from the second output node to the first node to convey a second output value opposite the first output value, wherein the current measurement resistor circuit is located in the drive path between a high voltage supply terminal of the drive path and the plurality of switches.

In yet another embodiment, a differential output driver circuit includes a drive path from a high voltage supply terminal to a low voltage supply terminal, the drive path including: a first output node that provides a first output differential signal and a second output node that provides a complementary output differential signal to the first output differential signal; a current control transistor to control current of the drive path; a current measurement resistor circuit located in the drive current path outside of a path segment between the first output node and the second output node, wherein current flowing through the drive path flows through the current measurement resistor circuit, wherein a voltage across the current measurement resistor circuit is indicative of an amount of current flowing through the drive path; a transistor control circuit that utilizes a voltage across the current measurement resistor circuit to control a control terminal of the current control transistor to control the current in the drive path to provide a desired differential output voltage swing between the first output node and the second output node. In a further aspect, the differential output driver circuit further includes a plurality of switches, wherein the plurality of switches control current to flow from the first output node to the second output node when conveying a first output value and control current to flow from the second output node to the first node to convey a second output value opposite the first output value; wherein the current measurement resistor circuit is located in the current path between a low voltage supply terminal of the current path and the plurality of switches; wherein the current control transistor is located in the current path between a high voltage supply terminal and the plurality of switches.

What is claimed is:

1. A differential output driver circuit, comprising:
    a drive path including:
        a first output node that provides a first output differential signal and a second output node that provides a complementary second output differential signal to the first output differential signal;
        a current control transistor to control current of the drive path;
        a current measurement resistor circuit located in the drive current path outside of a path segment between the first output node and the second output node, wherein current flowing through the drive path flows through the current measurement resistor circuit, wherein a voltage across the current measurement resistor circuit is indicative of an amount of current flowing through the drive path;
    transistor control circuit that utilizes a voltage across the current measurement resistor circuit to control a control terminal of the current control transistor to control the current in the drive path based on the voltage across the current measurement resistor circuit, wherein:
        the transistor control circuit includes an operational amplifier with a first input to receive a voltage indicative of the voltage across the current measurement resistor circuit, a second input to receive a reference voltage which is indicative of a target voltage swing between the first output node and the second output node, and an output coupled to the control terminal of the current control transistor to modulate the current of the drive path so that the voltage across the current measurement resistor circuit matches the reference voltage.

2. The differential output driver circuit of claim 1 wherein the current controlled by the current control transistor is set by the transistor control circuit to provide the target voltage swing between the first output node and the second output node.

3. The differential output driver circuit of claim 1 further comprising:
    a plurality of switches, wherein the plurality of switches control current to flow from the first output node to the second output node when conveying a first output value and control current to flow from the second output node to the first node to convey a second output value opposite the first output value;
    wherein the current measurement resistor circuit is located in the current path between a low voltage supply terminal of the drive path and the plurality of switches.

4. The differential output driver circuit of claim 3 wherein the current control transistor is located in the drive path between a high voltage supply terminal of the drive path and the plurality of switches.

5. The differential output driver circuit of claim 1 further comprising:
    a plurality of switches, wherein the plurality of switches control current to flow from the first output node to the second output node when conveying a first output value and control current to flow from the second output node to the first node to convey a second output value opposite the first output value;
    wherein the current measurement resistor circuit is located in the current path between a high voltage supply terminal of the drive path and the plurality of switches.

6. The differential output driver circuit of claim 5 wherein the current control transistor is located in the drive path between a high voltage supply terminal and the plurality of switches.

7. The differential output driver circuit of claim 1 further comprising:
    a plurality of switches, wherein the plurality of switches control current to flow from the first output node to the second output node when conveying a first output value and control current to flow from the second output node to the first node to convey a second output value opposite the first output value;
    wherein the plurality of switches includes a first switch, a second switch, a third switch, and a fourth switch, the conductivity of the first switch and the second switch are controlled by a first input differential signal and the conductivity of the third switch and the fourth switch are controlled by a second input differential signal that is complementary to the first input differential signal, the first output node is connected to a first current terminal of the first switch and a first current terminal of the second switch, the second output node is connected to a first current terminal of the third switch and a first current terminals of the fourth switch.

8. The differential output driver circuit of claim 1 wherein the drive path includes a common mode voltage resistor circuit connected between the first output node and the second output node and including a sense node, the drive path includes a common mode voltage control transistor for controlling the common mode voltage of the first output differential signal and the second output differential signal, the differential output driver circuit includes:
- a common mode transistor control circuit that includes a first input coupled to the sense node and a second input coupled to receive a reference common mode voltage, the common mode transistor control circuit utilizes the first input and the second input to control a control terminal of the common mode voltage control transistor to control the common mode voltage of the first output differential signal and the second output differential signal.

9. A circuit including a plurality differential output driver circuits according to claim 1.

10. The circuit of claim 9 wherein the transistor control circuit of each differential output driver circuit of the plurality includes a comparison circuit with a first input to receive a voltage indicative of the voltage across the current measurement resistor circuit of the each differential output driver circuit, a second input to receive a reference voltage, and an output to control the control terminal of the current control transistor of the each differential output driver circuit, the circuit further comprising:
- a reference voltage generation circuit to provide the reference voltage to the first input of the comparison circuit of each differential output driver circuit of the plurality.

11. The circuit of claim 10 wherein the reference voltage is indicative of a desired voltage swing between the first output node and the second output node of each of the differential output driver circuits of the plurality.

12. A differential output driver circuit, comprising:
- a drive path including:
  - a first output node that provides a first output differential signal and a second output node that provides a complementary second output differential signal to the first output differential signal;
  - a current control transistor to control current of the drive path;
  - a current measurement resistor circuit located in the drive current path outside of a path segment between the first output node and the second output node, wherein current flowing through the drive path flows through the current measurement resistor circuit, wherein a voltage across the current measurement resistor circuit is indicative of an amount of current flowing through the drive path;
- transistor control circuit that utilizes a voltage across the current measurement resistor circuit to control a control terminal of the current control transistor to control the current in the drive path based on the voltage across the current measurement resistor circuit, wherein:
  - the transistor control circuit includes a comparison circuit with the first input to receive a voltage indicative of the voltage across the current measurement resistor circuit, a second input to receive a reference voltage, and an output to control the control terminal of the current control transistor; and
  - a second comparison circuit including a first input coupled to a first terminal of the current measurement resistor circuit, a second input coupled to a second terminal of the current measurement resistor circuit, and an output coupled to the first input of the comparison circuit.

13. A method of operating a differential output driver circuit, wherein the differential output driver circuit includes a drive path including a first output node that provides a first output differential signal and a second output node that provides a complementary output differential signal to the first output differential signal, the method comprises:
- providing first voltage indicative of a voltage across a current measurement resistor circuit located in the drive path outside of a path segment of the drive path between the first output node and the second output node, wherein current flowing through the drive path flows through the current measurement resistor circuit, wherein the voltage across the current measurement resistor circuit is indicative of an amount of current flowing through the drive path;
- using an operational amplifier receiving the first voltage and a reference voltage to produce a signal at an output coupled to a control terminal of a current control transistor of the drive path to modulate the current in the drive path so that the voltage across the measurement resistor circuit matches the reference voltage, wherein the reference voltage is indicative of a target voltage swing between the first output node and the second output node.

14. The method of claim 13 wherein the current controlled by the current control transistor is set to provide a desired differential output voltage swing between the first output node and the second output node.

15. The method of claim 13 wherein the drive path includes a plurality of switches, wherein the plurality of switches control current to flow from the first output node to the second output node when conveying a first output value and control current to flow from the second output node to the first output node to convey a second output value opposite the first output value, wherein the current measurement resistor circuit is located in the current path between a low voltage supply terminal of the drive path and the plurality of switches.

16. The method of claim 15 wherein the current control transistor is located in the current path between a high voltage supply terminal of the drive path and the plurality of switches.

17. The method of claim 13 wherein the drive path includes a plurality of switches, wherein the plurality of switches control current to flow from the first output node to the second output node when conveying a first output value and control current to flow from the second output node to the first node to convey a second output value opposite the first output value, wherein the current measurement resistor circuit is located in the drive path between a high voltage supply terminal of the drive path and the plurality of switches.

18. A differential output driver circuit:
- a drive path from a high voltage supply terminal to a low voltage supply terminal, the drive path including:
  - a first output node that provides a first output differential signal and a second output node that provides a complementary output differential signal to the first output differential signal;
  - a current control transistor to control current of the drive path;
  - a current measurement resistor circuit located in the drive current path outside of a path segment between the first output node and the second output node, wherein current flowing through the drive path flows through the current measurement resistor circuit, wherein a voltage across the current measurement resistor circuit is indicative of an amount of current flowing through the drive path;

a transistor control circuit that utilizes a voltage across the current measurement resistor circuit to control a control terminal of the current control transistor to control the current in the drive path to provide a target differential output voltage swing between the first output node and the second output node, wherein:

the transistor control circuit includes an operational amplifier having a first input to receive a voltage indicative of the voltage across the current measurement resistor circuit, a second input to receive a reference voltage which is indicative of the target differential output voltage swing between the first output node and the second output node, and an output coupled to the control terminal of the current control transistor to modulate the current of the drive path so that the voltage across the current measurement resistor circuit matches the reference voltage.

19. The differential output driver of claim 18 further comprising:

a plurality of switches, wherein the plurality of switches control current to flow from the first output node to the second output node when conveying a first output value and control current to flow from the second output node to the first node to convey a second output value opposite the first output value;

wherein the current measurement resistor circuit is located in the current path between a low voltage supply terminal of the current path and the plurality of switches;

wherein the current control transistor is located in the current path between a high voltage supply terminal and the plurality of switches.

* * * * *